(12) United States Patent
Chen et al.

(10) Patent No.: US 9,536,601 B2
(45) Date of Patent: Jan. 3, 2017

(54) THRESHOLD VOLTAGE GROUPING OF MEMORY CELLS IN SAME THRESHOLD VOLTAGE RANGE

(71) Applicant: Macronix International Co., Ltd., Hsinchu (TW)

(72) Inventors: Chung-Kuang Chen, Hsinchu (TW);
Han-Sung Chen, Hsinchu (TW);
Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/533,936

(22) Filed: Nov. 5, 2014

(65) Prior Publication Data

US 2016/0125922 A1    May 5, 2016

(51) Int. Cl.
| | | |
|---|---|---|
| *G11C 16/04* | (2006.01) | |
| *G11C 11/56* | (2006.01) | |
| *G11C 16/10* | (2006.01) | |
| *G11C 16/34* | (2006.01) | |

(52) U.S. Cl.
CPC .......... *G11C 11/5628* (2013.01); *G11C 16/10* (2013.01); *G11C 16/3481* (2013.01); *G11C 2211/5642* (2013.01)

(58) Field of Classification Search
CPC .............................. G11C 16/10; G11C 11/5628

USPC ........................................ 365/185.19, 185.24
See application file for complete search history.

(56) References Cited

U.S. PATENT DOCUMENTS

| | | |
|---|---|---|
| 7,330,376 B1 | 2/2008 | Chen et al. |
| 8,130,571 B2 | 3/2012 | Shinagawa et al. |
| 8,391,069 B2 | 3/2013 | Kuo et al. |
| 8,472,257 B2 * | 6/2013 | Dong ................. G11C 11/5628 365/185.19 |
| 8,780,641 B2 | 7/2014 | Chen et al. |
| 2007/0291556 A1 * | 12/2007 | Kamei ............... G11C 11/5628 365/189.09 |
| 2008/0123406 A1 * | 5/2008 | Ho ..................... G11C 11/5628 365/185.03 |

* cited by examiner

*Primary Examiner* — Huan Hoang
(74) *Attorney, Agent, or Firm* — Haynes Beffel & Wolfeld LLP

(57) ABSTRACT

A memory cell undergoing programming is determined as belonging to a particular one of a plurality of second threshold voltage ranges that divide a present threshold voltage range of the particular memory cell. Programming pulses are applied to program the particular memory cell to within the target threshold voltage range. At least one of a program voltage and a total duration of the programming pulses applied to the particular memory cell is varied, depending on the particular second threshold voltage range of the memory cell.

20 Claims, 11 Drawing Sheets

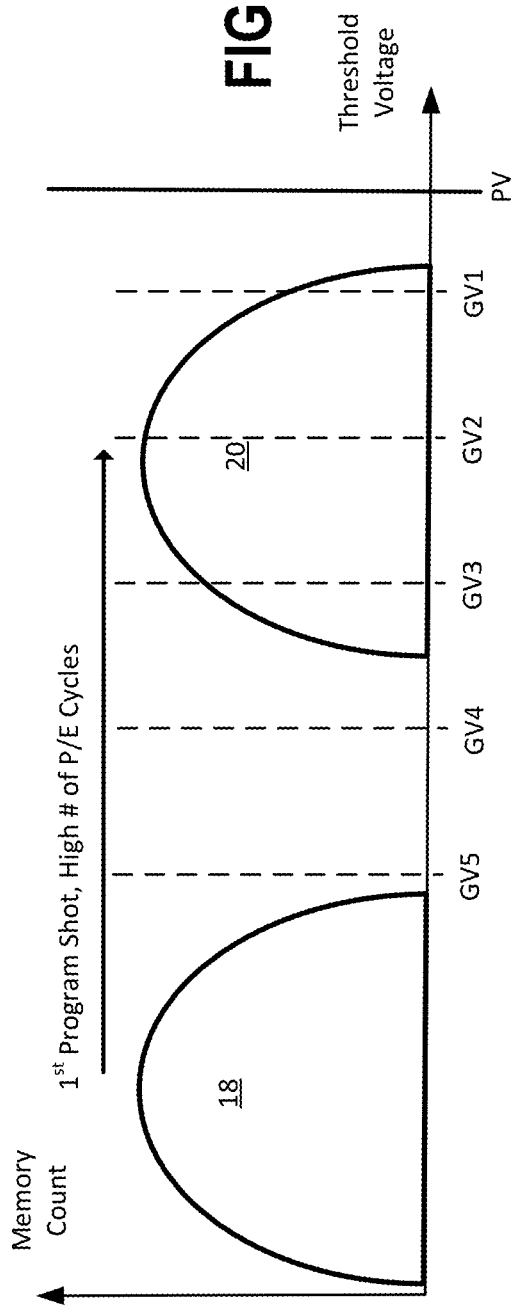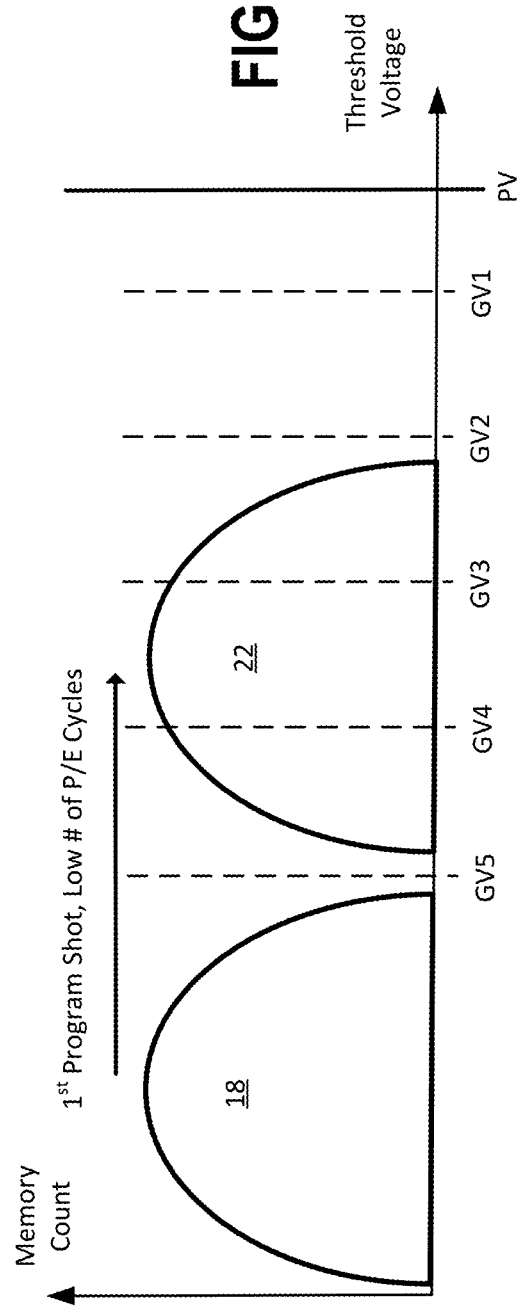

THRESHOLD VOLTAGE GROUPING OF MEMORY CELLS IN SAME THRESHOLD VOLTAGE RANGE

BACKGROUND

Field of the Invention

This technology relates to a page buffer of a memory array.

Description of Related Art

Programming a memory cell relies on multiple programming pulses, such as via ISPP (incremental step pulse programming). Different memory cells across an array may behave non-uniformly during programming for various reasons such as variations in manufacturing, temperature, voltage, and disturb effects. Because of such lack of uniformity, different memory cells require a different number of programming pulses, despite nominally starting the program operation from the same beginning logical level and nominally ending the program operation at the same finishing logical level. This can be displayed by a threshold voltage distribution graph of number of memory cells versus threshold voltage, which shows that a relatively non-uniform group of memory cells has a wide, short distribution, and that a relatively uniform group of memory cells has a narrow, tall distribution.

The relatively non-uniform group of memory cells requires more program and verify cycles than the relatively uniform group of memory cells. Accordingly, there is a wide variation in the duration of programming any individual memory cell or group of memory cells, even for memory cells that share the same nominal beginning logical level and the same nominal finishing logical level.

It would be desirable to adjust how memory cells are programmed, to reduce the variation in the duration of programming. It would also be desirable to reduce the duration of programming, even for a relatively non-uniform group of memory cells.

SUMMARY

One aspect of the technology is a memory device, comprising a memory array and control circuitry. The memory array includes a plurality of memory cells storing a same data value. The control circuitry programs the plurality of memory cells storing the same data value prior to said programming by the control circuitry. Said programming by the control circuitry includes:

regarding the plurality of memory cells occupying a first threshold voltage range, characterizing memory cells in the plurality of memory cells as belonging to one of a plurality of threshold voltage subranges that divide the first threshold voltage range; and applying programming pulses to program the plurality of memory cells, and varying the programming pulses depending on the particular ones of the plurality of threshold voltage subranges to which the memory cells in the plurality of memory cells belong.

In one embodiment of the technology, said programming by the control circuitry includes:

prior to said characterizing the memory cells and prior to said applying the programming pulses, applying at least one early programming pulse to the plurality of memory cells.

In one embodiment of the technology, said programming by the control circuitry includes:

prior to said characterizing the memory cells and prior to said applying the programming pulses, applying no early programming pulses to the plurality of memory cells.

One embodiment of the technology further comprises a plurality of memory access circuits coupled to a plurality of bit lines in the memory array. The plurality of bit lines are coupled to the plurality of memory cells. The plurality of memory access circuits include a plurality of sense nodes selectively coupled to the plurality of bit lines to read and program data via the plurality of bit lines, Said programming by the control circuitry includes:

storing the particular ones of the plurality of threshold voltage subranges to which the memory cells in the plurality of memory cells belong in the plurality of memory access circuits.

In one embodiment of the technology, said programming by the control circuitry includes:

storing respective target threshold voltage ranges of the plurality of memory cells in the plurality of memory access circuits.

In one embodiment of the technology, the plurality of memory access circuits include a plurality of p-type transistors having gate terminals coupled to the plurality of sense nodes. The plurality of p-type transistors selectively couple a reference voltage to a plurality of latch nodes in the plurality of memory access circuits.

In one embodiment of the technology, said programming by the control circuitry includes:

prior to said characterizing, characterizing an upper boundary of the first threshold voltage range.

In one embodiment of the technology, said programming by the control circuitry includes:

prior to said characterizing, characterizing a lower boundary of the first threshold voltage range.

In one embodiment of the technology, said programming by the control circuitry includes:

prior to said characterizing, characterizing a peak of the first threshold voltage range.

In one embodiment of the technology, said varying the programming pulses depends also on respective target threshold voltage ranges of the memory cells in the plurality of memory cells.

In one embodiment of the technology, one or more program verify periods of one or more target threshold voltage ranges are skipped, responsive to said one or more program verify periods not characterizing any of the plurality of memory cells.

In one embodiment of the technology, said programming pulses are divided into a plurality of discrete programming periods dedicated to a plurality of combinations of the plurality of threshold voltage subranges and the respective target threshold voltage ranges.

In one embodiment of the technology, one or more particular combinations in the plurality of combinations are skipped, responsive to said one or more particular combinations not characterizing any of the plurality of memory cells.

In one embodiment of the technology, memory cells of the plurality of memory cells have a same target threshold voltage range.

In one embodiment of the technology, memory cells of the plurality of memory cells have different target threshold voltage ranges.

Another aspect of the technology is a method of programming memory, comprising:

receiving a program instruction at an integrated circuit to program a plurality of memory cells storing a same data value; then regarding the plurality of memory cells occupying a first threshold voltage range, characterizing memory cells in the plurality of memory cells as belonging to one of a plurality of threshold voltage subranges that divide the first threshold voltage range; and then applying programming pulses to program the plurality of memory cells, and varying the programming pulses depending on the particular ones of the plurality of threshold voltage subranges to which the memory cells in the plurality of memory cells belong.

One embodiment of the technology further comprises:
prior to said characterizing, characterizing an upper boundary of the first threshold voltage range.

One embodiment of the technology further comprises:
prior to said characterizing, characterizing a lower boundary of the first threshold voltage range.

One embodiment of the technology further comprises:
prior to said characterizing, characterizing a peak of the first threshold voltage range.

In embodiment of the technology, said varying the programming pulses depends also on respective target threshold voltage ranges of the memory cells in the plurality of memory cells.

In embodiment of the technology, one or more program verify periods of one or more target threshold voltage ranges are skipped, responsive to said one or more program verify periods not characterizing any of the plurality of memory cells.

In embodiment of the technology, said programming pulses are divided into a plurality of discrete programming periods dedicated to a plurality of combinations of the plurality of threshold voltage subranges and the respective target threshold voltage ranges.

In embodiment of the technology, one or more particular combinations in the plurality of combinations are skipped, responsive to said one or more particular combinations not characterizing any of the plurality of memory cells.

A further aspect of the technology is a method of making a memory device, as described herein, comprising:
providing a memory array including a plurality of memory cells; and
providing control circuitry programming the plurality of memory cells storing a same data value prior to said programming by the control circuitry, said programming by the control circuitry including:
regarding the plurality of memory cells occupying a first threshold voltage range, characterizing memory cells in the plurality of memory cells as belonging to one of a plurality of threshold voltage subranges that divide the first threshold voltage range; and
applying programming pulses to program the plurality of memory cells, and varying the programming pulses depending on the particular ones of the plurality of threshold voltage subranges to which the memory cells in the plurality of memory cells belong.

The various aspects include further embodiments as described herein.

BRIEF DESCRIPTION OF THE DRAWINGS

FIGS. 10 and 11 are threshold voltage distribution graphs of memory cells that undergo a first program pulse at different points in the number of program/erase cycles experienced by the memory cells.

DETAILED DESCRIPTION

Figure 1:
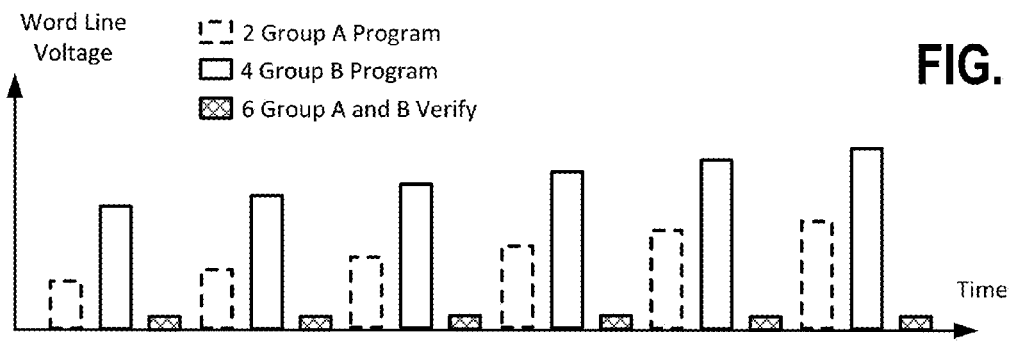
FIG. 1 is an example graph of word line voltage versus time, for program and program verify of memory cells grouped into different parts of a threshold voltage range.

FIG. 1 is an example graph of word line voltage versus time, for program and program verify of memory cells grouped into different parts of a threshold voltage range.

Shown are a sequence of program and program verify pulses of a program operation. In a single iteration of program and program verify pulses, the different memory cell groups A and B receive program pulses, program pulse 2 for group A and program pulse 4 for group B. After the pulses are applied to the different memory cell groups, program verify 6 is performed for the different memory cell groups A and B. As shown in more detail in connection with other figures, the different memory cell groups A and B are associated with memory cells which began in the same threshold voltage range that represents a same data value. The memory cells can be SLC (single level cell or 1 bit), MLC (multi-level cell or 2 bits), TLC (triple level cell or 3 bits), or more bits.

The magnitude of program pulse 2 for group A rises with subsequent iterations, and program pulse 4 for group 4 rises with subsequent iterations. In another embodiment, the word line voltage magnitude can remain the same, or follow another pattern other than strictly increasing magnitude. The magnitude of program verify pulses does not rise with subsequent iterations.

Figure 2:
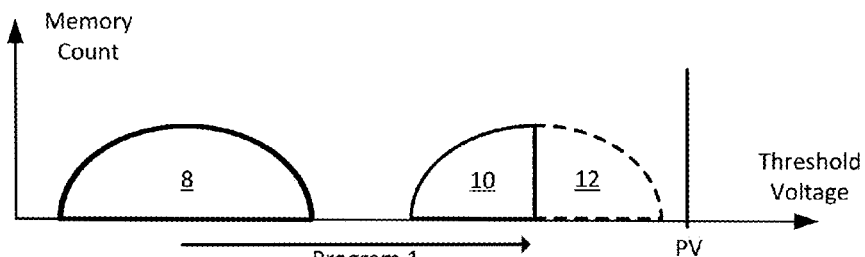
FIG. 2 is a threshold voltage distribution graph of memory cells that undergo a first program pulse.

FIG. 2 is a threshold voltage distribution graph of memory cells that undergo a first program pulse.

To account for threshold voltage variations among memory cells, and the program and erase behavior of memory cells that varies with the number of program and erase cycles, the program operation allows for a varying number, varying voltage magnitude, and/or varying duration of program pulses to be applied in a program operation. A pulse indicates a signal applied for some duration, and does not limit the shape of the signal waveform.

Threshold voltage distribution 8 represents memory cells that begin with a same data value stored on the memory cells, represented by stored threshold voltages within a beginning threshold voltage range. A first pulse, referred to as Program 1, applied to the memory cells with threshold voltage distribution 8 results in memory cells with threshold voltage distributions 10 and 12. This pulse is referred to as a first pulse for naming convenience, and can be the initial program pulse applied in a program operation, or a pulse subsequent to the initial program pulse applied in a program operation.

In combination, threshold voltage distributions 10 and 12 represent the memory cells which began the program operation with threshold voltage distribution 8 representing a same data value stored in the memory cells, and experienced the first program pulse. Threshold voltage distributions 10 and 12 respectively have a lower threshold voltage range and a higher threshold voltage range.

In the event that the memory cells are MLC (multi-level cell or 2 bits), TLC (triple level cell or 3 bits), or some other multi-bit memory cell, the initial threshold voltage distribution 8 can be the lowest magnitude erased threshold voltage distribution, or any other threshold voltage distribution other than the highest magnitude most programmed threshold voltage distribution. As the target threshold voltage distribution, the program operation can specify the next higher magnitude threshold voltage distribution, the highest magnitude threshold voltage distribution, or any other threshold voltage distribution in between. The program operation can also specify different destination threshold voltage distributions for different memory cells.

Figure 3:
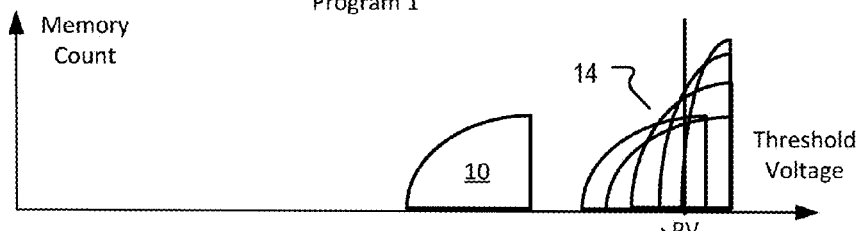
FIG. 3 is a threshold voltage distribution graph of memory cells undergoing a sequence of program pulses, applied to a selected group of memory cells in FIG. 2 that already experienced a first program pulse.

FIG. 3 is a threshold voltage distribution graph of memory cells undergoing a sequence of program pulses, applied to a selected group of memory cells in FIG. 2 that already experienced a first program pulse.

Memory cells in threshold voltage distribution 10 undergo a sequence of program pulses, referred to as Program 2a, to raise the distribution's magnitude past the program verify voltage. Generally, with subsequent pulses, the distribution's magnitude rises and the distribution's width narrows.

Figure 4:
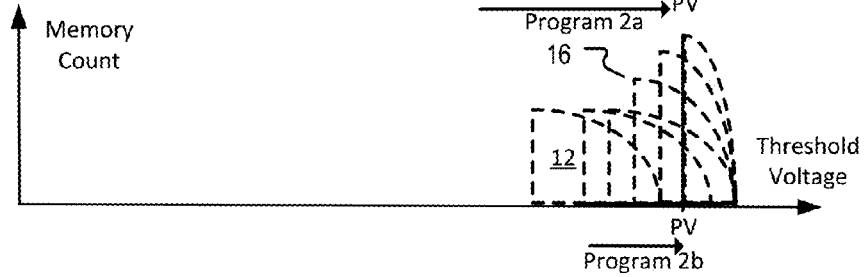
FIG. 4 is a threshold voltage distribution graph of memory cells undergoing a sequence of program pulses, applied to another selected group of memory cells in FIG. 2 that already experienced a first program pulse.

FIG. 4 is a threshold voltage distribution graph of memory cells undergoing a sequence of program pulses, applied to another selected group of memory cells in FIG. 2 that already experienced a first program pulse.

Memory cells in threshold voltage distribution 12 undergo a sequence of program pulses, referred to as Program 2b, to raise the distribution's magnitude past the program verify voltage. Generally, with subsequent pulses, the distribution's magnitude rises and the distribution's width narrows.

Comparing FIGS. 3 and 4, threshold voltage distribution 10 has a large gap with the program verify voltage, and threshold voltage distribution 12 has a small gap with the program verify voltage. Program pulses applied to threshold voltage distribution 10 have a larger magnitude, or larger duration, in comparison with the corresponding program pulses applied to threshold voltage distribution 12. Accordingly, the overall duration of pulses (either of, or both of, duration of individual pulses and number of pulses) applied to threshold voltage distribution 10 can decrease. The result is fewer iterations of program and program verify, and a faster programming operation.

Figure 5:
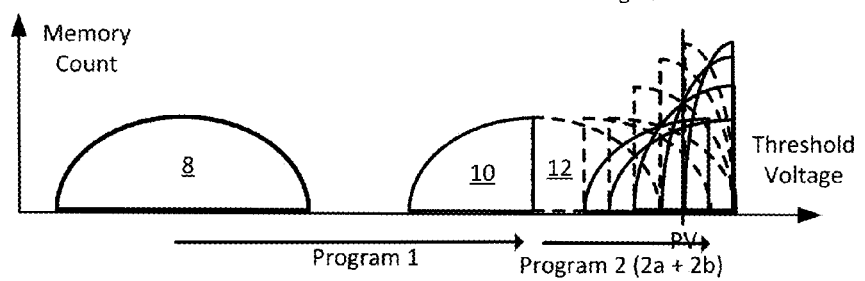
FIG. 5 is a threshold voltage distribution graph of memory cells undergoing program, combining the groups of FIGS. 3 and 4.

FIG. 5 is a threshold voltage distribution graph of memory cells undergoing program, combining the groups of FIGS. 3 and 4.

The first program pulse, referred to as Program 1, applied to the memory cells with threshold voltage distribution 8 results in memory cells with threshold voltage distributions 10 and 12. A sequence of program pulses, referred to as Program 2, raises the threshold voltage distributions 10 and 12 to their target distribution past the program verify voltage. The sequence of program pulses, referred to as Program 2, actually includes two sequences of program pulses, Program 2a applied to threshold voltage distribution 10, and Program 2b applied to threshold voltage distribution 12.

Figure 6:
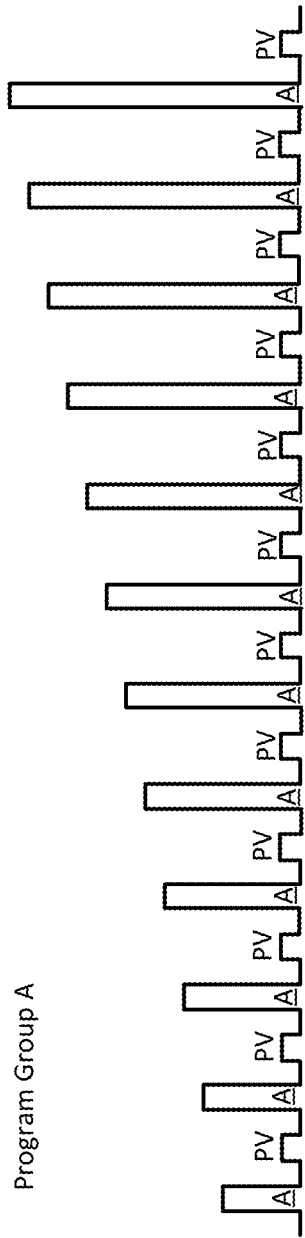
FIGS. 6-8 are example graphs of word line voltage versus time, for program and program verify of memory cells grouped into a different number of groups, each group including different parts of a threshold voltage range.
Figure 7:
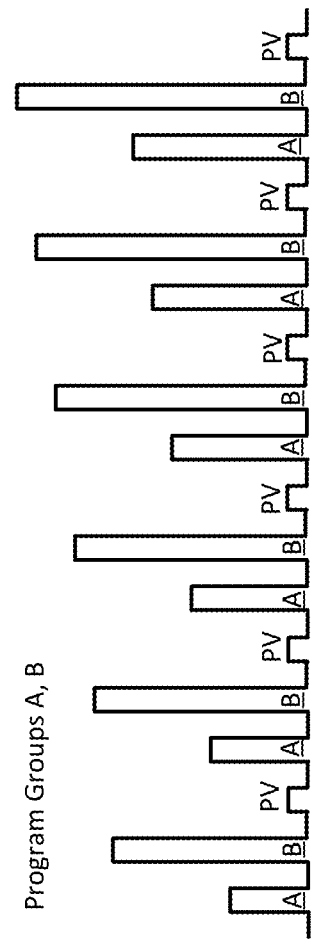
Figure 8:
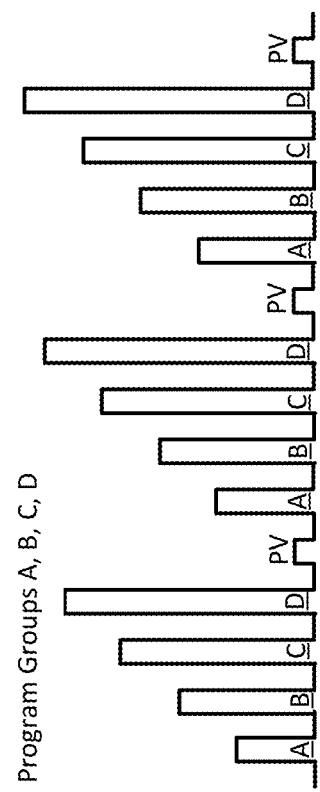

FIGS. 6-8 are example graphs of word line voltage versus time, for program and program verify of memory cells grouped into a different number of groups, each group including different parts of a threshold voltage range. The magnitude of program pulse for each group rises with subsequent iterations. In another embodiment, the word line voltage magnitude can remain the same, or follow another pattern other than strictly increasing magnitude. The magnitude of program verify pulses does not rise with subsequent iterations.

In FIG. 6, memory cells are not grouped. The memory cells which store threshold voltages within a same threshold voltage range representing same data, are not grouped into different threshold voltage ranges.

In FIG. 7, memory cells are grouped into 2 different groups A and B. The memory cells which store threshold voltages within a same threshold voltage range representing same data, are grouped into 2 different threshold voltage ranges. In a single iteration of program and program verify pulses, the different memory cell groups A and B receive different program pulses. After the pulses are applied to the different memory cell groups A and B, program verify is performed for the different memory cell groups A and B.

In FIG. 8, memory cells are grouped into 4 different groups A, B, C, and D. The memory cells which store threshold voltages within a same threshold voltage range representing same data, are grouped into 4 different threshold voltage ranges. In a single iteration of program and program verify pulses, the different memory cell groups A, B, C, and D receive different program pulses. After the pulses are applied to the different memory cell groups A, B, C, and D, program verify is performed for the different memory cell groups A, B, C, and D.

In other embodiments, more than one target threshold voltage range exists, with a corresponding number of verify pulses equal to the number of target threshold voltage ranges.

Figure 9:
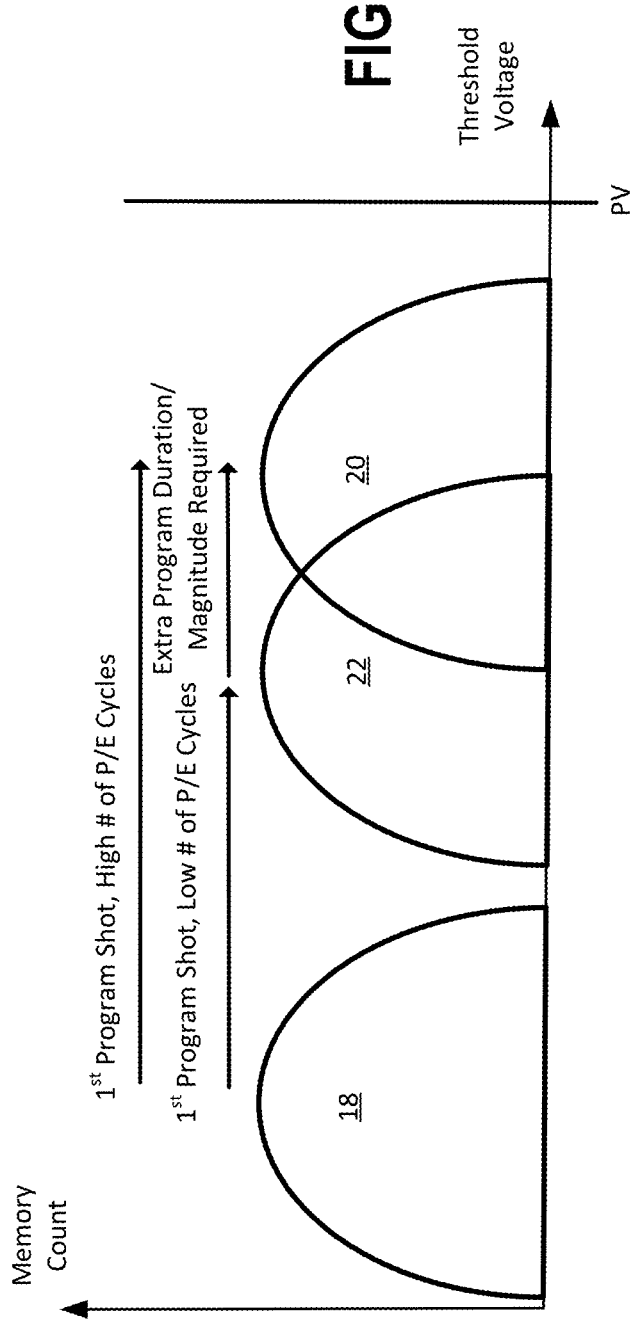
FIG. 9 is a threshold voltage distribution graph of memory cells that undergo a first program pulse.

FIG. 9 is a threshold voltage distribution graph of memory cells that undergo a first program pulse.

Threshold voltage distribution 18 represents memory cells that begin with a same data value stored on the memory cells, represented by stored threshold voltages within a beginning threshold voltage range.

As memory cells undergo an increasing number of program and erase cycles, the program and erase behavior changes. For example, a program pulse applied to a memory cell with relatively many program and erase cycles can cause a relatively large threshold voltage shift, resulting in threshold voltage distribution 20. The same program pulse applied to a memory cell with relatively few program and erase cycles can cause a relatively small threshold voltage shift, resulting in threshold voltage distribution 22.

This difference in the behavior of threshold voltage shift can be accounted for by changing the threshold voltage ranges defining the groups of memory cells, as discussed in connection with FIGS. 10 and 11.

FIGS. 10 and 11 are threshold voltage distribution graphs of memory cells that undergo a first program pulse at different points in the number of program/erase cycles experienced by the memory cells. Threshold voltage distribution 18 represents memory cells that begin with a same data value stored on the memory cells, represented by stored threshold voltages within a beginning threshold voltage range.

In FIG. 10, the first program pulse is applied to a memory cell with relatively many program and erase cycles, causing a relatively large threshold voltage shift, resulting in threshold voltage distribution 20. The threshold voltages GV1, GV2, GV3, GV4, and GV5 divide up the possible threshold voltage locations of the threshold voltage distribution 20. In the example, the largest magnitude threshold voltage in threshold voltage distribution 20 is between GV1 and PV.

In FIG. 11, the first program pulse is applied to a memory cell with relatively few program and erase cycles, causing a relatively small threshold voltage shift, resulting in threshold voltage distribution 22. The threshold voltages GV1, GV2, GV3, GV4, and GV5 divide up the possible threshold voltage locations of the threshold voltage distribution 22. In the example, the largest magnitude threshold voltage in threshold voltage distribution 20 is between GV2 and GV3.

In some embodiments, the first pulse results in the at least part of the threshold voltage range exceeding the program verify voltage PV.

Comparing threshold voltage distributions 20 and 22, the potential range of threshold positions can vary significantly, such that the threshold voltage ranges defining the groups also vary significantly. In some embodiments, the groups are defined without a first program pulse, although this reduces the accuracy and effectiveness of the groups.

Figure 12:
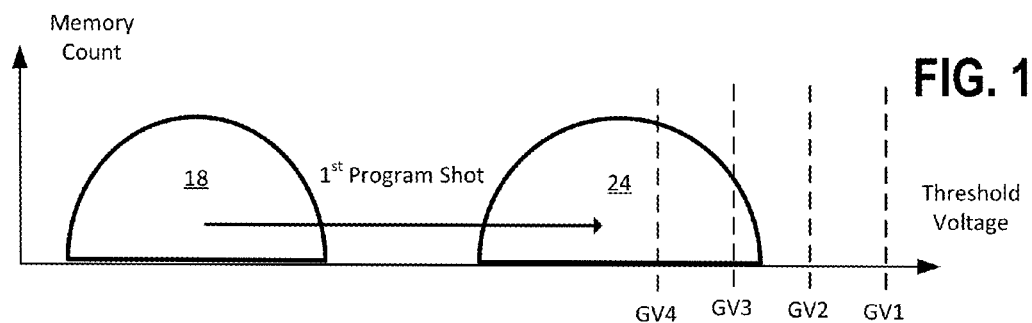
FIGS. 12-14 are threshold voltage distribution graphs of memory cells at different points of the process of dividing the memory cells into different groups.
Figure 13:
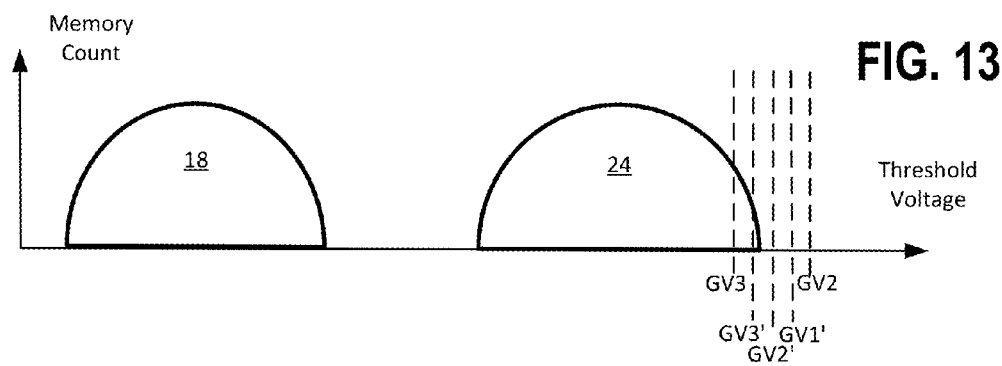
Figure 14:
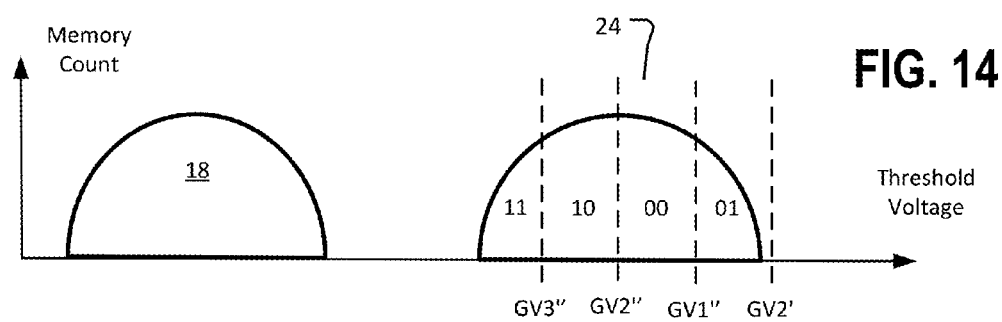

FIGS. 12-14 are threshold voltage distribution graphs of memory cells at different points of the process of dividing the memory cells into different groups. Threshold voltage distribution 18 represents memory cells that begin with a same data value stored on the memory cells, represented by stored threshold voltages within a beginning threshold voltage range.

In FIG. 12, the first program pulse causes a threshold voltage shift to threshold voltage distribution 24. The threshold voltages GV1, GV2, GV3, and GV4 divide up, with a relatively coarse resolution, the possible threshold voltage locations of the largest magnitude of the threshold voltage distribution 20. In the example, the largest magnitude threshold voltage in threshold voltage distribution 20 is between GV2 and GV3. Various embodiments can divide possible threshold voltage locations of the largest magnitude of the threshold voltage distribution 20 into more or fewer coarse resolution ranges, with regular or irregular threshold voltage spacings.

In FIG. 13, the threshold voltages GV1', GV2', and GV3' divide up, with a relatively fine resolution in comparison to FIG. 12, the possible threshold voltage locations of the largest magnitude of the threshold voltage distribution 20. From preceding FIG. 12, the largest magnitude threshold voltage in threshold voltage distribution 20 is between GV2 and GV3. After FIG. 13, the largest magnitude threshold voltage in threshold voltage distribution 20 is narrowed to between GV2' and GV3'. Various embodiments can divide possible threshold voltage locations of the largest magnitude of the threshold voltage distribution 20 into more or fewer fine resolution ranges, with regular or irregular threshold voltage spacings.

In FIG. 14, the memory cells are divided into multiple groups, with the threshold voltage ranges based on the largest magnitude threshold voltage determined by the fine resolution threshold voltage range search of FIG. 13. The ranges are defined by the threshold voltages GV2', GV1", GV2", GV3". With the ranges having data bit names 01, 00, 10, and 11.

The number of threshold voltage ranges can be a power of 2 represented by a number of bits equal to the power of 2, or another number other than a power of 2.

Figure 15:
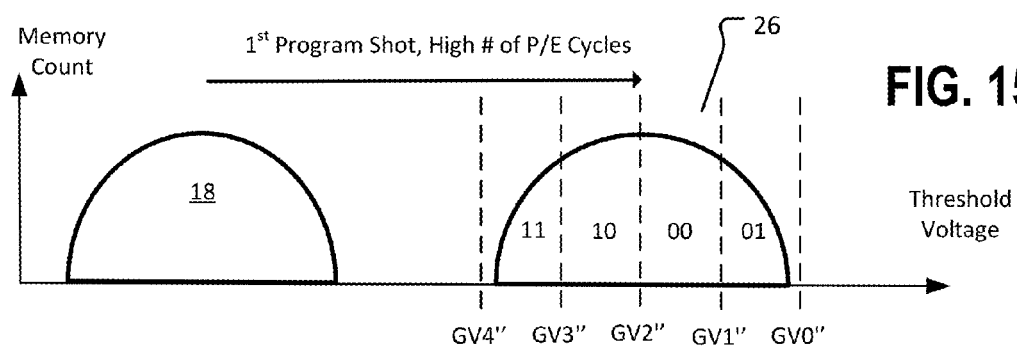
FIGS. 15 and 16 are threshold voltage distribution graphs of memory cells divided into different groups, for memory cells at different points in the number of program/erase cycles experienced by the memory cells.
Figure 16:
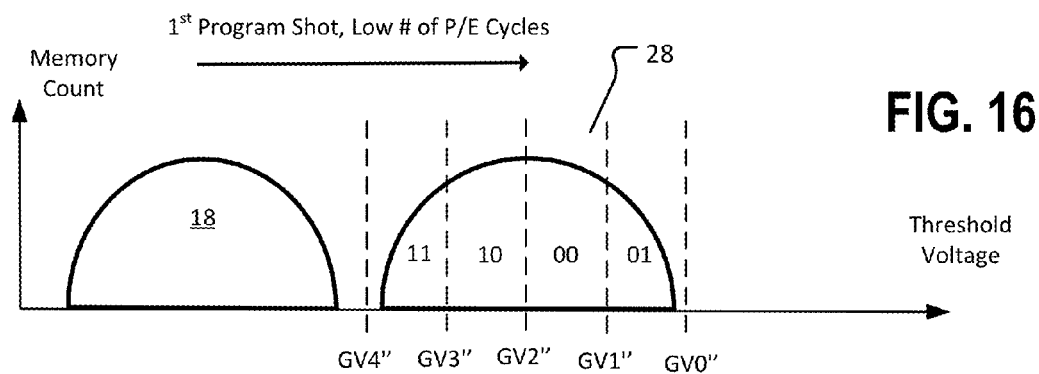

FIGS. 15 and 16 are threshold voltage distribution graphs of memory cells divided into different groups, for memory cells at different points in the number of program/erase cycles experienced by the memory cells. Threshold voltage distribution 18 represents memory cells that begin with a same data value stored on the memory cells, represented by stored threshold voltages within a beginning threshold voltage range.

In FIG. 15, the first program pulse is applied to a memory cell with relatively many program and erase cycles, causing a relatively large threshold voltage shift, resulting in threshold voltage distribution 26. The threshold voltages GV0", GV1", GV2", GV3", and GV4" define the threshold voltage ranges divide up the threshold voltage distribution 26.

In FIG. 16, the first program pulse is applied to a memory cell with relatively few program and erase cycles, causing a relatively small threshold voltage shift, resulting in threshold voltage distribution 28. The threshold voltages GV0", GV1", GV2", GV3", and GV4" define the threshold voltage ranges divide up the threshold voltage distribution 26.

Comparing FIGS. 15 and 16, the threshold voltage ranges dividing up the threshold voltage distribution are significantly different between threshold voltage distributions 26 and 28. By searching for the largest magnitude of the threshold voltage distribution after the first program pulse, the threshold voltage distributions are more accurately defined.

Figure 17:
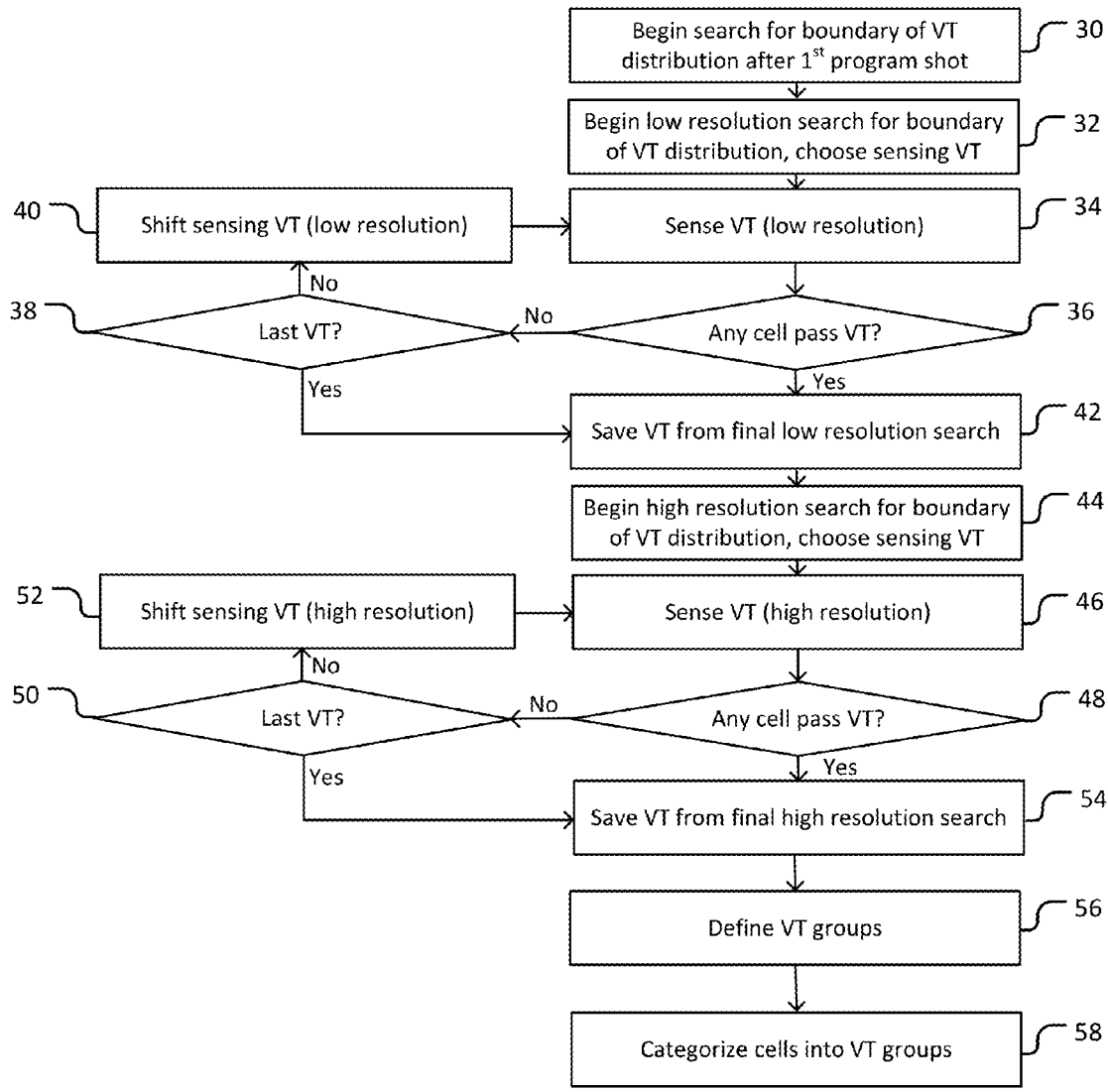
FIG. 17 is an example process flow of dividing the memory cells into different groups, with an earlier coarse resolution threshold voltage search and a later fine resolution threshold voltage search.

FIG. 17 is an example process flow of dividing the memory cells into different groups, with an earlier coarse resolution threshold voltage search and a later fine resolution threshold voltage search.

At 30, the boundary search begins for the upper boundary of the threshold voltage distribution of memory cells, after a first program pulse or a first program shot applied to memory cells of a threshold voltage distribution representing memory cells that begin with a same data value stored on the memory cells. Other embodiments search for the lower boundary and/or the peak. An example is shown in FIG. 12, when a first program shot applied to threshold voltage distribution 18 results in threshold voltage distribution 24.

In the shown process flow, a coarse resolution search is followed by a fine resolution search. In other embodiments, a single search is performed, or 3 or more searches of varying resolutions are performed. More searches increase the precision of the final result, but at the cost of increased duration. Fewer searches shorten the duration, at the cost of worsened precision.

An example of a low or coarse resolution search for the upper boundary of the threshold voltage distribution of memory cells is shown at FIG. 12. Other embodiments search for the lower boundary and/or the peak. At 32, the low resolution search begins. An initial sensing threshold voltage is chosen for the low resolution search. At 34, sensing is performed at the chosen sensing threshold voltage.

At 36, it is determined whether any memory cells in the threshold voltage distribution have a threshold voltage less than the chosen sensing threshold voltage. If not, then the process flow continues to 38. In terms of FIG. 12, this occurs when the chosen threshold voltage is GV1 and then GV2. If yes, then the process flow continues to 42. In terms of FIG. 12, this occurs when the chosen threshold voltage is GV3.

At 38, it is determined whether the chosen sensing threshold voltage is the last the sensing voltage to be chosen. If not, then the process flow continues to 40. If yes, then the process flow continues to 42.

At 40, a new sensing threshold voltage is chosen. In terms of FIG. 12, this occurs when the chosen threshold voltage changes from GV1 to GV2, and then from GV2 to GV3. The process then loops back to 34.

At 42, the chosen sensing threshold voltage from the final low resolution search is saved. In terms of FIG. 12, GV3 is saved.

At 44, the high resolution search begins. An initial sensing threshold voltage is chosen for the high resolution search. At 46, sensing is performed at the chosen sensing threshold voltage.

At 48, it is determined whether any memory cells in the threshold voltage distribution have a threshold voltage less than the chosen sensing threshold voltage. If not, then the process flow continues to 50. In terms of FIG. 13, this occurs when the chosen threshold voltage is GV1' and then GV2'. If yes, then the process flow continues to 54. In terms of FIG. 13, this occurs when the chosen threshold voltage is GV3'.

At 50, it is determined whether the chosen sensing threshold voltage is the last the sensing voltage to be chosen. If not, then the process flow continues to 52. If yes, then the process flow continues to 54.

At 52, a new sensing threshold voltage is chosen. In terms of FIG. 13, this occurs when the chosen threshold voltage changes from GV1' to GV2', and then from GV2' to GV3'. The process then loops back to 46.

At 54, the chosen sensing threshold voltage from the final high resolution search is saved. In terms of FIG. 13, GV3' is saved.

At 56, the threshold voltage range groups are defined. In terms of FIG. 14, this occurs when the groups ranges are defined by the threshold voltages GV2', GV1", GV2", GV3", with the ranges having data bit names 01, 00, 10, and 11. The number of threshold voltage ranges can be a power of 2 represented by a number of bits equal to the power of 2, or another number other than a power of 2.

At 58, the memory cells are categorized into the different memory cell groups defined at 56.

Figure 18:
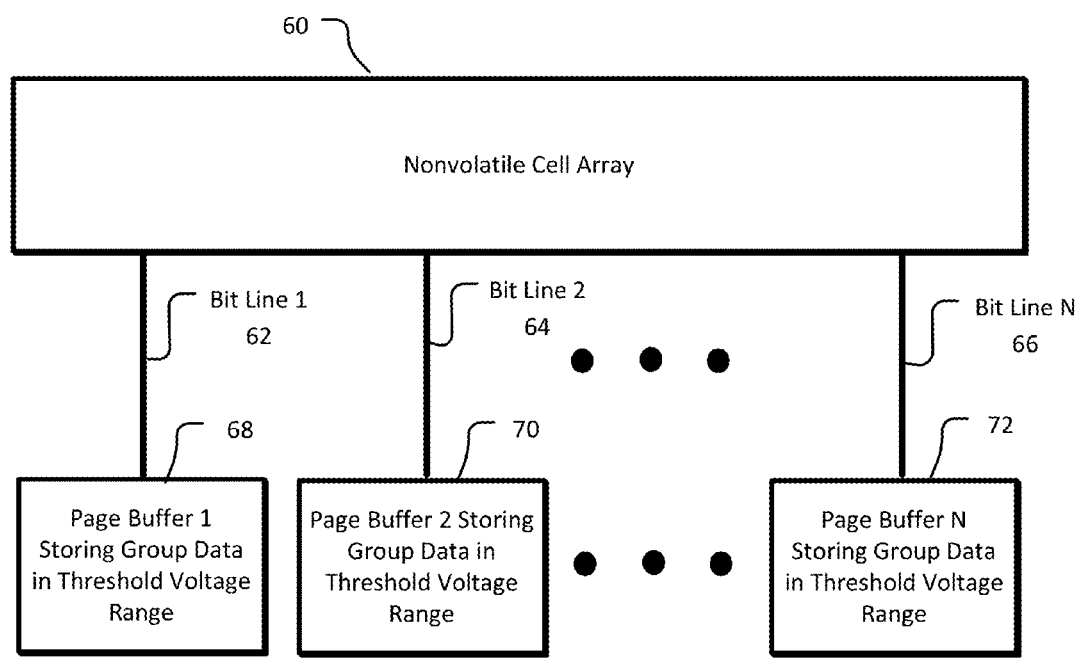
FIG. 18 is an example arrangement of a memory array with multiple page buffers that store memory cell threshold voltage group data.

FIG. 18 is an example arrangement of a memory array with multiple page buffers that store memory cell threshold voltage group data.

Nonvolatile memory array 60 is coupled to a set of bit lines, including bit line 1 62, bit line 2 64, and bit line N 66. Each of the bit lines is coupled to a corresponding page buffer. Bit line 1 62 is coupled to page buffer 1 68. Bit line 2 64 is coupled to page buffer 2 70. Bit line N 66 is coupled to page buffer N 72. The page buffers are memory access circuits with sense nodes selectively coupled to the bit lines to read and program data of the memory cells. The page buffers store memory cell threshold voltage group data.

Figure 19:
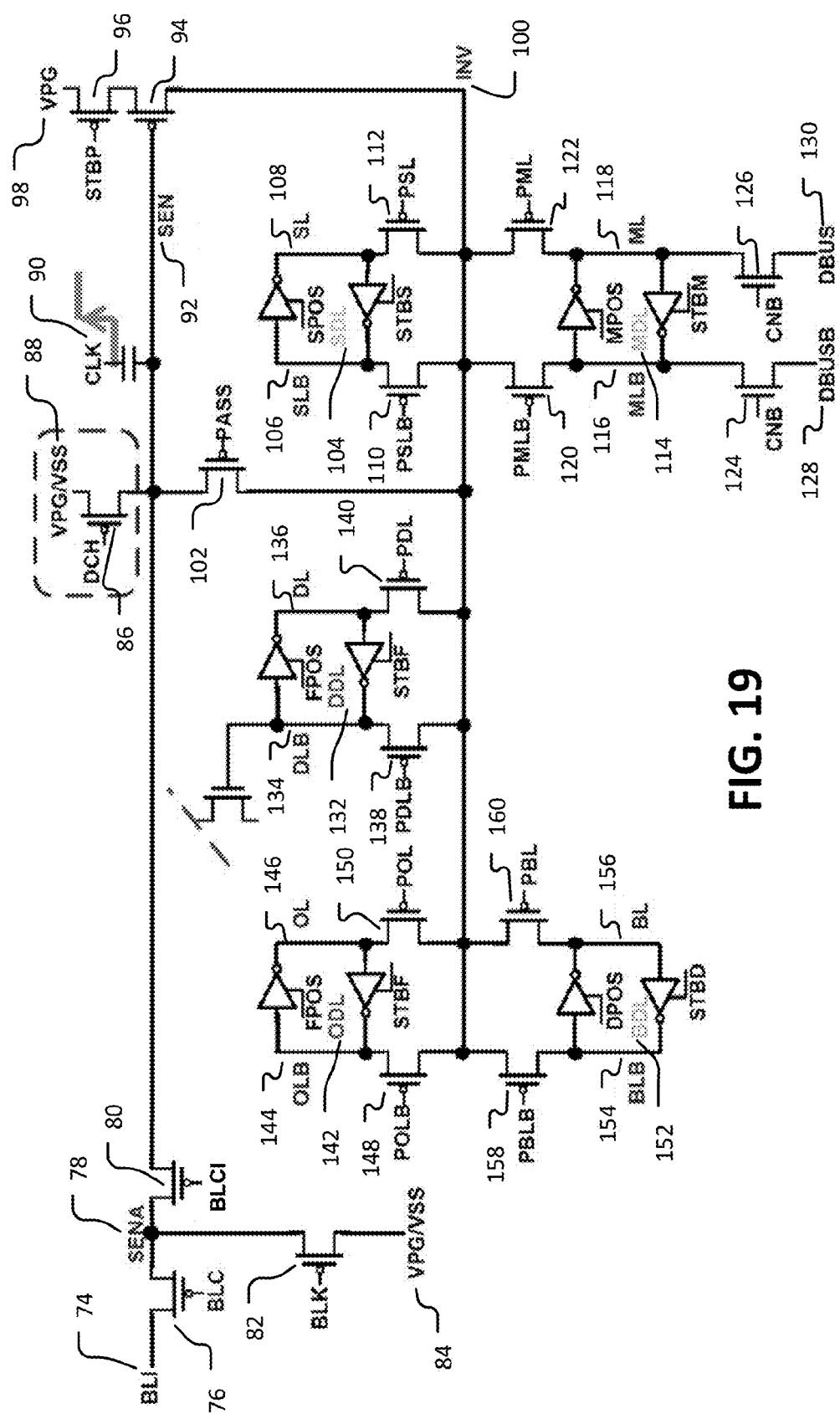
FIG. 19 is an example page buffer that stores memory cell threshold voltage group data.

FIG. 19 is an example page buffer that stores memory cell threshold voltage group data.

Node BLI 74 indicates the bit line and is coupled to node SENA 78 via p-type transistor 76 receiving signal BLC. Node SENA 78 is coupled to node VPG/VSS 84 via p-type transistor 82 receiving signal BLK. Node SENA 78 is coupled to node SEN 92 via p-type transistor 80 receiving signal BLCI. Node SEN 92 is coupled to node VPG/VSS 88 via p-type transistor 86 receiving signal DCH. Node SEN 92 is coupled to signal CLK via a capacitor. P-type transistor 94 has a gate coupled to node SEN 92, a first current carrying terminal coupled to node INV 100 and a second current carrying terminal coupled to p-type transistor 96. P-type transistor 96 has a gate receiving signal STBP, a first current carrying terminal coupled to p-type transistor 94, and a second current carrying terminal coupled to VPG 98. Node SEN 92 is coupled to node INV 100 via p-type transistor 102 receiving signal PASS.

Node INV is coupled to 5 latches SDL 104, MDL 114, DDL 132, ODL 142, and BDL 152. Latch SDL 104 includes complementary nodes SLB 106 and SL 108. Node SLB 106 is coupled to node INV 100 via p-transistor 110 receiving signal PSLB. Node SL 108 is coupled to node INV 100 via p-transistor 112 receiving signal PSL.

Latch MDL 114 includes complementary nodes MLB 116 and ML 118. Node MLB 116 is coupled to node INV 100 via p-transistor 120 receiving signal PMLB. Node ML 118 is coupled to node INV 100 via p-transistor 122 receiving signal PML.

Node MLB 116 is coupled to DBUSB 128 via n-type transistor 124 receiving signal CNB. Node ML 118 is coupled to DBUS 130 via n-type transistor 126 receiving signal CNB.

Latch DDL 132 includes complementary nodes DLB 134 and DL 136. Node DLB 134 is coupled to node INV 100 via p-transistor 138 receiving signal PDLB. Node DL 136 is coupled to node INV 100 via p-transistor 140 receiving signal PDL.

Latch ODL 142 includes complementary nodes OLB 144 and OL 146. Node OLB 146 is coupled to node INV 100 via p-transistor 148 receiving signal POLB. Node OL 146 is coupled to node INV 100 via p-transistor 150 receiving signal POL.

Latch BDL 152 includes complementary nodes BLB 154 and BL 156. Node BLB 154 is coupled to node INV 100 via p-transistor 158 receiving signal PBLB. Node BL 156 is coupled to node INV 100 via p-transistor 160 receiving signal PBL.

Figure 20:
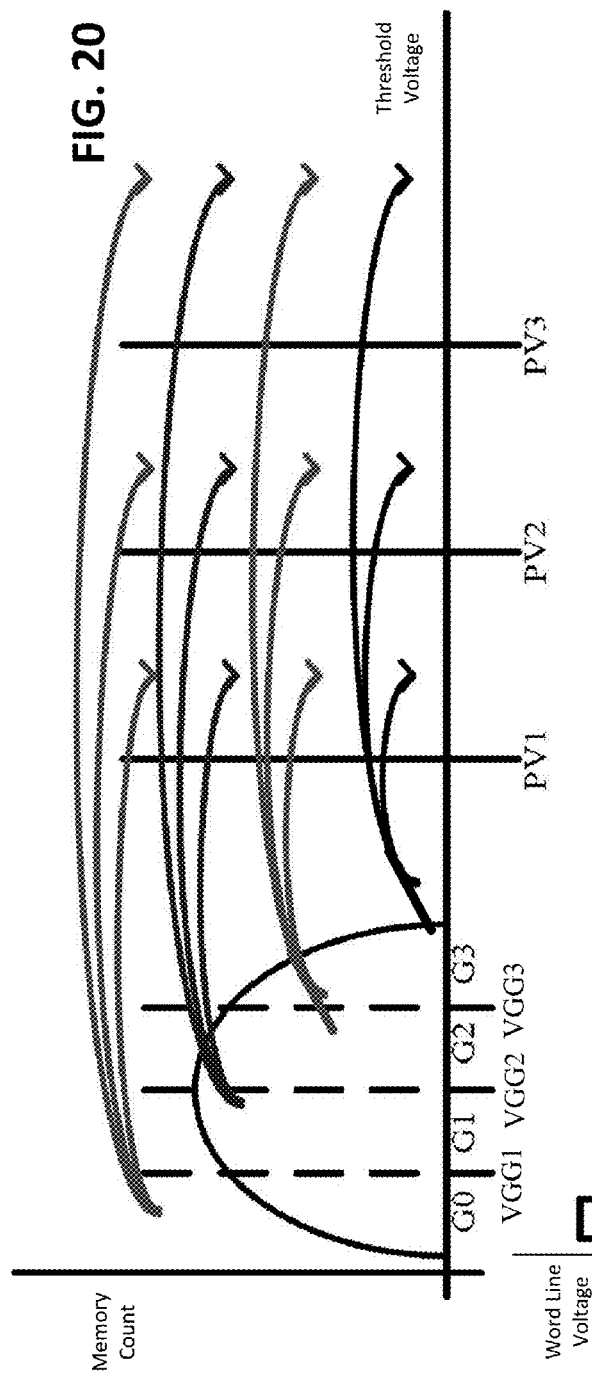
FIG. 20 is a threshold voltage distribution graph of memory cells that shows how memory cells in different groups and with different target threshold voltage ranges have different programming pulses.

FIG. 20 is a threshold voltage distribution graph of memory cells that shows how memory cells in different groups and with different target threshold voltage ranges have different programming pulses.

Memory cells are divided into multiple groups such as G0, G1, G2, G3 of different threshold voltage ranges. The combination of the groups can be memory cells after an initial program pulse, such as in FIG. 15 or 16. Memory cells receive different program pulses depending on their group G0, G1, G2, or G3. Within each group, memory cells receive different program pulses depending on their target threshold voltage range, indicated by different program verify voltages PV1, PV2, and PV3. Other embodiments have a different number of groups and/or a different number of target threshold voltage ranges.

Figure 21:
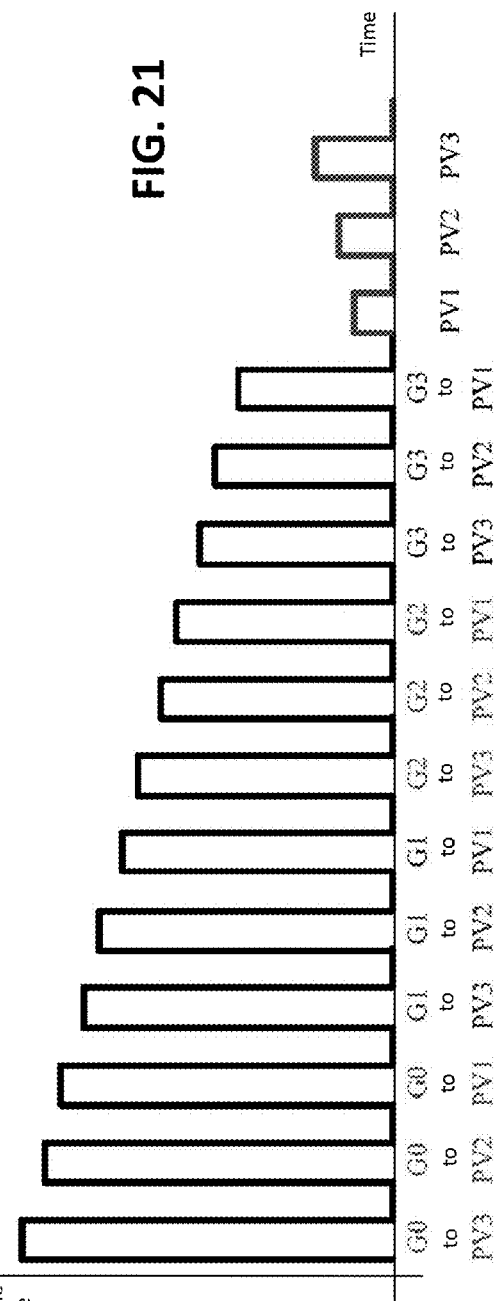
FIG. 21 is an example graph of word line voltage versus time, for program of memory cells from different parts of a threshold voltage range to different target threshold voltage ranges, and for program verify.

FIG. 21 is an example graph of word line voltage versus time, for program of memory cells from different parts of a threshold voltage range to different target threshold voltage ranges, and for program verify.

First, all the memory cells in group G0 are programmed, then memory cells in group G1, memory cells in group G2, and memory cells in group G3. Within each group, first memory cells are programmed to target threshold voltage range with program verify voltage PV1, then PV2, and then PV3. Other embodiments can skip combinations of groups and target threshold voltages that fail to characterize any of the memory cells undergoing programming. The word line voltage generally decreases.

After all memory cells are programmed, program is performed for the different target threshold voltage ranges with program verify voltage PV1, then PV2, and then PV3. Other embodiments can skip program verify voltages that fail to characterize any of the memory cells undergoing programming. The word line voltage generally increases.

In other embodiments, the memory cells can be programmed in different order and verified in different order.

The following discussion about FIGS. 19-21 indicates how to change the contents of the latches ODL 142 and BDL 154 to store the group of the memory cell accessed by the page buffer. Depending on the combination of bits stored in latches ODL 142 and BDL 154, the memory cell accessed by the page buffer belongs to group g0, g1, g2, or g3. Other embodiments include a different number of latches to identify a different number of groups. The following steps are performed to perform sensing for one group. The steps are then repeated for the next group, until all groups are sensed. In cases where there are 4 bit strings, the different bits in the 4 bit strings correspond to the 4 different states which can be sensed. In cases where there is no multi-bit string, the same step is performed for each group. In case where the data at the SEN node is moved to a latch, the data at the SEN node selectively turns on the p-type transistor 94 and thus selectively couples VPG 98 to the latch.

Step 1. Preset MBL
VPG→BLI. Node VPG 98 couples to node BLI 74.
Step 2. Setup MBL & SEN
BLI→VSS. Node BLI 74 couples to signal VSS 88.
Step 3. SEN clocking low, sensing. Signal CLK 90 goes low. Node SEN 92 senses the memory cell current.
For VGG1 group_1 sensing, SEN 0000→1000
For VGG2 group_2 sensing, SEN 0000→1100
For VGG3 group_3 sensing SEN 0000→1110
Step 4. SEN clocking high. Signal CLK 90 goes high. Transistor 80 turns off, decoupling node SEN 92 from node SENA 78.
Step 5. Strobe BLB. Selectively couple VPG 98 to BDL 152 or ODL 142.
VGG1 group_1 sensing BLB 0000→0111
VGG2 group_2 sensing OLB 0000→0011
VGG3 group_3 sensing BL 1000→1001

The following discussion about FIGS. 19-21 indicates how to use the contents of latches SDL 104 and MDL 114 which store the target threshold voltage range of the memory cell accessed by the page buffer, and use the contents of latches ODL 142 and BDL 154 which store the group of the memory cell accessed by the page buffer, to perform programming of the memory cell accessed by the page buffer. Other embodiments include a different number of latches to identify a different number of target threshold voltage ranges. The following steps are performed to perform programming from one group to one target threshold voltage range. The steps are then repeated until all groups to all target threshold voltage ranges are programmed. In cases where there are 4 bit strings, the different bits in the 4 bit strings correspond to the 4 different states which can be sensed or programmed. In cases where there is no multi-bit string, the same step is performed for each state. In case where the data at the SEN node is moved to a latch, the data at the SEN node selectively turns on the p-type transistor 94 and thus selectively couples VPG 98 to the latch.

Step 1. Reset DDL latch. Couple DDL latch 132 to VPG 98.
Step 2. Set DDL latch.
Step 2a. Move data from MDL latch 114 to SEN node 92.
G0toPV3 MLB→SEN 0110
G0toPV2 ML→SEN 1001
G0toPV1 ML→SEN 1001
G1toPV3 MLB→SEN 0110
G1toPV2 ML→SEN 1001
G1toPV1 ML→SEN 1001
G2toPV3 MLB→SEN 0110
G2toPV2 ML→SEN 1001
G2toPV1 ML→SEN 1001
G3toPV3 MLB→SEN 0110
G3toPV2 ML→SEN 1001
G3toPV1 ML→SEN 1001
Step 2b. Move data from SEN node 92 to DDL latch 132.
G0toPV3 SEN→DLB from 0000 to 1001
G0toPV2 SEN→DLB from 0000 to 0110
G0toPV1 SEN→DLB from 0000 to 0110
G1toPV3 SEN→DLB from 0000 to 1001
G1toPV2 SEN→DLB from 0000 to 0110
G1toPV1 SEN→DLB from 0000 to 0110
G2toPV3 SEN→DLB from 0000 to 1001
G2toPV2 SEN→DLB from 0000 to 0110
G2toPV1 SEN→DLB from 0000 to 0110
G3toPV3 SEN→DLB from 0000 to 1001
G3toPV2 SEN→DLB from 0000 to 0110
G3toPV1 SEN→DLB from 0000 to 0110
Step 2c. Move data from SDL latch 104 to SEN node 92.
G0toPV3 SLB→SEN 0011
G0toPV2 SLB→SEN 0011
G0toPV1 SL→SEN 1100
G1toPV3 SLB→SEN 0011
G1toPV2 SLB→SEN 0011
G1toPV1 SL→SEN 1100
G2toPV3 SLB→SEN 0011
G2toPV2 SLB→SEN 0011
G2toPV1 SLB→SEN 0011
G3toPV3 SLB→SEN 0011
G3toPV2 SLB→SEN 0011
G3toPV1 SL→SEN 1100
Step 2d. Move data from SEN node 92 to DDL latch 132.
G0toPV3 SEN→DL 0110 to 1110
G0toPV2 SEN→DL 1001 to 1101
G0toPV1 SEN→DL 1001 to 1011
G1toPV3 SEN→DL 0110 to 1110
G1toPV2 SEN→DL 1001 to 1101
G1toPV1 SEN→DL 1001 to 1011
G2toPV3 SEN→DL 0110 to 1110
G2toPV2 SEN→DL 1001 to 1101
G2toPV1 SEN→DL 1001 to 1101
G3toPV3 SEN→DL 0110 to 1110
G3toPV2 SEN→DL 1001 to 1101

G3toPV1 SEN→DL 1001 to 1011
Note that 1110 correspond to PV3, 1101 to PV2, and 1011 to PV1.
Step 2e. Move data from BDL latch 154 to SEN node 92.
G0toPV3 BL→SEN 1001
G0toPV2 BL→SEN 1001
G0toPV1 BL→SEN 1001
G1toPV3 BLB→SEN 0110
G1toPV2 BLB→SEN 0110
G1toPV1 BLB→SEN 0110
G2toPV3 BLB→SEN 0110
G2toPV2 BLB→SEN 0110
G2toPV1 BLB→SEN 0110
G3toPV3 BL→SEN 1001
G3toPV2 BL→SEN 1001
G3toPV1 BL→SEN 1001
Step 2f. Move data from SEN node 92 to DDL latch 132.
G0toPV3 SEN→DL x'x'x'x' to x'11x'
G0toPV2 SEN→DL x'x'x'x' to x'11x'
G0toPV1 SEN→DL x'x'x'x' to x'11x'
G1toPV3 SEN→DL x'x'x'x' to 1x'x'1
G1toPV2 SEN→DL x'x'x'x' to 1x'x'1
G1toPV1 SEN→DL x'x'x'x' to 1x'x'1
G2toPV3 SEN→DL x'x'x'x' to 1x'x'1
G2toPV2 SEN→DL x'x'x'x' to 1x'x'1
G2toPV1 SEN→DL x'x'x'x' to 1x'x'1
G3toPV3 SEN→DL x'x'x'x' to x'11x'
G3toPV2 SEN→DL x'x'x'x' to x'11x'
G3toPV1 SEN→DL x'x'x'x' to x'11x'
Step 2g. Move data from ODL latch 142 to SEN node 92.
G0toPV3 OL→SEN 1100
G0toPV2 OL→SEN 1100
G0toPV1 OL→SEN 1100
G1toPV3 OL→SEN 1100
G1toPV2 OL→SEN 1100
G1toPV1 OL→SEN 1100
G2toPV3 OLB→SEN 0011
G2toPV2 OLB→SEN 0011
G2toPV1 OLB→SEN 0011
G3toPV3 OLB→SEN 0011
G3toPV2 OLB→SEN 0011
G3toPV1 OLB→SEN 0011
Step 2h. Move data from SEN node 92 to DDL latch 132.
G0toPV3 SEN→DL x'11x' to x'111
G0toPV2 SEN→DL x'11x' to x'111
G0toPV1 SEN→DL x'11x' to x'111
G1toPV3 SEN→DL 1x'x'1 to 1x'11
G1toPV2 SEN→DL 1x'x'1 to 1x'11
G1toPV1 SEN→DL 1x'x'1 to 1x'11
G2toPV3 SEN→DL 1x'x'1 to 11x'1
G2toPV2 SEN→DL 1 x'x'1 to 11x'1
G2toPV1 SEN→DL 1x'x'1 to 11x'1
G3toPV3 SEN→DL x'11x' to 111x'
G3toPV2 SEN→DL x'11x' to 111x'
G3toPV1 SEN→DL x'11x' to 111x'
Step 3. Program. Move data from DDL latch 132 to SEN node 92.
G0toPV3 DL→SEN x'111
G0toPV2 DL→SEN x'111
G0toPV1 DL→SEN x'111
G1toPV3 DL→SEN 1x'11
G1toPV2 DL→SEN 1x'11
G1toPV1 DL→SEN 1x'11
G2toPV3 DL→SEN 11x'1
G2toPV2 DL→SEN 11x'1
G2toPV1 DL→SEN 11x'1
G3toPV3 DL→SEN 111x'
G3toPV2 DL→SEN 111x'
G3toPV1 DL→SEN 111x'
Note that G0 corresponds to x'111, G1 to 1x'11, G2 to 11x'1, and G3 to 111x'.

Figure 22:
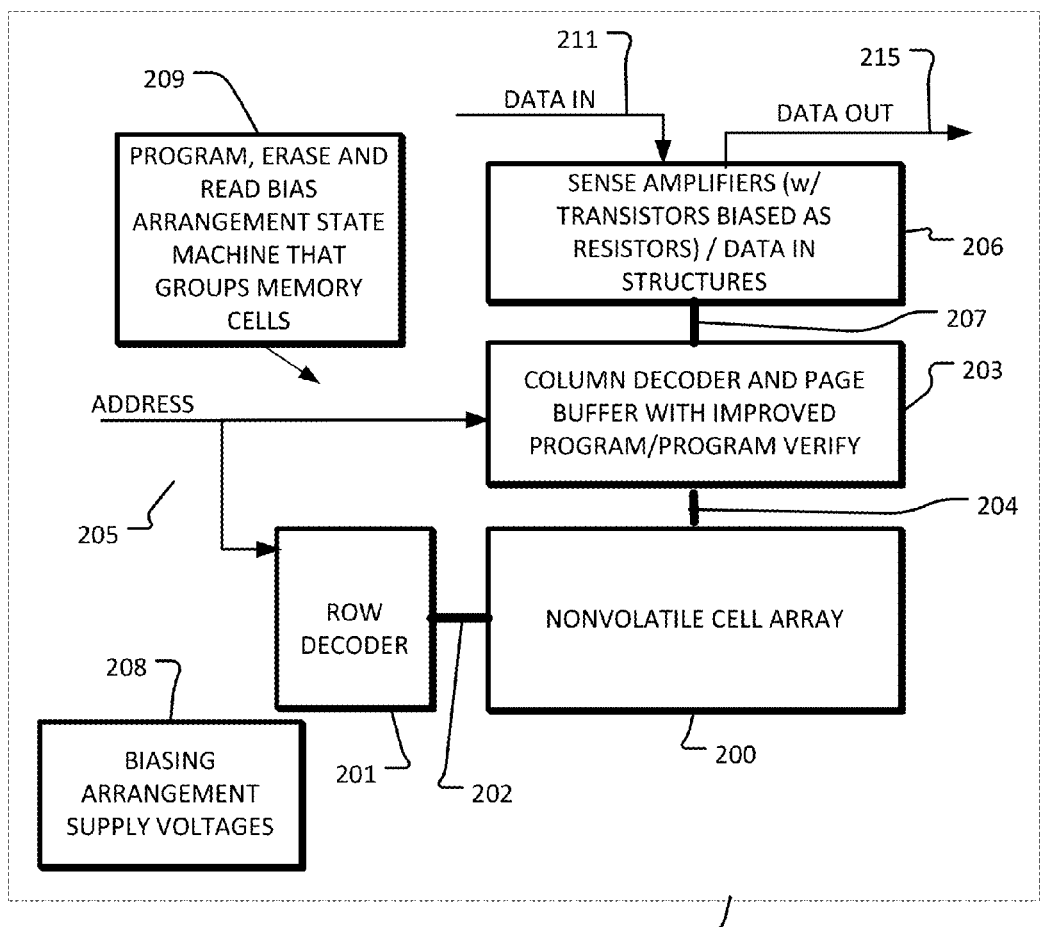
FIG. 22 is a simplified block diagram of an example integrated circuit that divides memory cells into different threshold voltage groups and with page buffers that store the threshold voltage group data.

FIG. 22 is a simplified block diagram of an example integrated circuit that divides memory cells into different threshold voltage groups and with page buffers that store the threshold voltage group data.

An integrated circuit 250 includes a memory array 200. A word line decoder and word line drivers 201 is coupled to, and in electrical communication with, a plurality of word lines 202, and arranged along rows in the memory array 200. A bit line decoder and drivers 203 are coupled to and in electrical communication with a plurality of bit lines 204 arranged along columns in the memory array 200 for reading data from, and writing data to, the memory cells in the memory array 200. Addresses are supplied on bus 205 to the word line decoder and drivers 201 and to the bit line decoder 203. Sense amplifiers which are coupled to transistors bias as resistors as disclosed herein, and data-in structures in block 206, are coupled to the bit line decoder 203 via the bus 207. Data is supplied via the data-in line 211 from input/output ports on the integrated circuit 250, to the data-in structures in block 206. Data is supplied via the data-out line 215 from the sense amplifiers in block 206 to input/output ports on the integrated circuit 250, or to other data destinations internal or external to the integrated circuit 250. Program, erase, and read bias arrangement state machine circuitry 209 responds to a program command by performing program and program verify operations.

The circuitry 209 can perform:
categorizing a particular memory cell as belonging to a particular threshold voltage range of a plurality of threshold voltage ranges, the plurality of threshold voltage ranges dividing a present threshold voltage range of a particular memory cell; and
applying programming pulses to program the particular memory cell to within the target threshold voltage range, and varying at least one of a program voltage and a total duration of the programming pulses applied to the particular memory cell depending on the particular threshold voltage range of the particular memory cell.

The circuitry 209 can perform also:
identifying a largest magnitude threshold voltage search range occupied by the largest magnitude threshold voltage stored by the plurality of memory cells, the largest magnitude threshold voltage search range in a plurality of threshold voltage search ranges dividing a first threshold voltage search range; and
applying programming pulses to program the plurality of memory cells to within respective target threshold voltage ranges, and varying at least one of a program voltage and a total duration of the programming pulses applied to the plurality of memory cells depending at least on the largest magnitude threshold voltage search range occupied by the largest magnitude threshold voltage stored by the plurality of memory cells.

The circuitry 209 can perform also apply a different number of program pulse numbers in view of different program verify levels, eliminating surplus program pulses necessary to program different parts of the beginning threshold voltage distribution to the target, ex: there are G0toPV3, G0toPV2, G0toPV1, G1toPV3, G1toPV2, G1toPV1, G2toPV3, G2toPV2, G2toPV1, G3toPV3, G3toPV2, G3toPV1. Example embodiments include program pulse before program verify (using FIG. 21); following program pulses can only be G0, G1, G2 and G3 (using FIG. 8); and following program pulses can be G0toPV3, G0toPV2, G0toPV1, G1toPV3, G1toPV2, G1toPV1, G2toPV3, G2toPV2, G2toPV1, G3toPV3, G3toPV2, G3toPV1 (combining FIG. 8 and FIG. 21)

The circuitry 209 can perform also, other features disclosed herein.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
a memory array including a plurality of bit lines and a plurality of memory cells storing a same data value;
a plurality of memory access circuits coupled to the plurality of bit lines in the memory array, the plurality of bit lines coupled to the plurality of memory cells, the plurality of memory access circuits including a plurality of sense nodes selectively coupled to the plurality of bit lines to read and program data via the plurality of bit lines; and
control circuitry programming the plurality of memory cells, the plurality of memory cells storing the same data value prior to said programming by the control circuitry, said programming by the control circuitry including:
regarding the plurality of memory cells occupying a first threshold voltage range, characterizing memory cells in the plurality of memory cells as belonging to particular threshold voltage subranges in a plurality of threshold voltage subranges that divide the first threshold voltage range;
storing the particular threshold voltage subranges in the plurality of threshold voltage subranges, to which the memory cells in the plurality of memory cells belong, in memory coupled to the plurality of memory access circuits; and
applying programming pulses to program the plurality of memory cells, the programming pulses having magnitudes that vary depending on the particular threshold voltage subranges in the plurality of threshold voltage subranges to which the memory cells in the plurality of memory cells belong.

2. The device of claim 1, wherein said programming by the control circuitry includes:
prior to said characterizing the memory cells and prior to said applying the programming pulses, applying no early programming pulses to the plurality of memory cells.

3. The device of claim 1,
wherein said programming by the control circuitry includes:
storing respective target threshold voltage ranges of the plurality of memory cells in the plurality of memory access circuits.

4. The device of claim 1, wherein said magnitudes of the programming pulses also depend on respective target threshold voltage ranges of the memory cells in the plurality of memory cells.

5. The device of claim 4, wherein one or more program verify periods of one or more target threshold voltage ranges are skipped, responsive to said one or more program verify periods not characterizing any of the plurality of memory cells.

6. The device of claim 4, wherein said programming pulses are divided into a plurality of discrete programming periods dedicated to a plurality of combinations of the plurality of threshold voltage subranges and the respective target threshold voltage ranges.

7. The device of claim 1, wherein memory cells of the plurality of memory cells have a same target threshold voltage range.

8. The device of claim 1, wherein memory cells of the plurality of memory cells have different target threshold voltage ranges.

9. A memory device, comprising:
a memory array including a plurality of bit lines and a plurality of memory cells storing a same data value; and
control circuitry programming the plurality of memory cells, the plurality of memory cells storing the same data value prior to said programming by the control circuitry, said programming by the control circuitry including:
regarding the plurality of memory cells occupying a first threshold voltage range, characterizing memory cells in the plurality of memory cells as belonging to particular threshold voltage subranges in a plurality of threshold voltage subranges that divide the first threshold voltage range; and
applying programming pulses to program the plurality of memory cells, the programming pulses having magnitudes that vary depending on the particular threshold voltage subranges in the plurality of threshold voltage subranges to which the memory cells in the plurality of memory cells belong, wherein said programming by the control circuitry includes:
prior to said characterizing the memory cells and prior to said applying the programming pulses, applying at least one early programming pulse to the plurality of memory cells to establish threshold voltages in said first threshold voltage range.

10. The device of claim 9,
further comprising:
a plurality of memory access circuits coupled to a plurality of bit lines in the memory array, the plurality of bit lines coupled to the plurality of memory cells, the plurality of memory access circuits including a plurality of sense nodes selectively coupled to the plurality of bit lines to read and program data via the plurality of bit lines,
wherein said programming by the control circuitry includes:
storing the particular threshold voltage subranges in the plurality of threshold voltage subranges to which the memory cells in the plurality of memory cells belong in the plurality of memory access circuits.

11. The device of claim 9,
wherein said programming by the control circuitry includes:
prior to said characterizing, characterizing an upper boundary of the first threshold voltage range.

12. The device of claim 9,
wherein said programming by the control circuitry includes:
prior to said characterizing, characterizing a lower boundary of the first threshold voltage range.

13. The device of claim 9,
wherein said programming by the control circuitry includes:
prior to said characterizing, characterizing a peak of the first threshold voltage range.

14. A method of programming memory, comprising:
receiving a program instruction at an integrated circuit to program a plurality of memory cells storing a same data value; then
regarding the plurality of memory cells occupying a first threshold voltage range, characterizing memory cells in the plurality of memory cells as belonging to particular threshold voltage subranges in a plurality of threshold voltage subranges that divide the first threshold voltage range;
storing the particular threshold voltage subranges in the plurality of threshold voltage subranges to which the memory cells in the plurality of memory cells belong; and then
applying programming pulses to program the plurality of memory cells, the programming pulses having magnitudes that vary depending on the stored particular threshold voltage subranges in the plurality of threshold voltage subranges to which the memory cells in the plurality of memory cells belong.

15. The method of claim 14, further comprising:
prior to said characterizing, applying at least one early programming pulse to the plurality of memory cells to establish threshold voltages in said first threshold voltage range; and characterizing an upper boundary of the first threshold voltage range.

16. The method of claim 14, further comprising:
prior to said characterizing, applying at least one early programming pulse to the plurality of memory cells to establish threshold voltages in said first threshold voltage range; and characterizing a lower boundary of the first threshold voltage range.

17. The method of claim 14, wherein said magnitudes of the programming pulses also depend on respective target threshold voltage ranges of the memory cells in the plurality of memory cells.

18. The method of claim 17, wherein one or more program verify periods of one or more target threshold voltage ranges are skipped, responsive to said one or more program verify periods not characterizing any of the plurality of memory cells.

19. The method of claim 17, wherein said programming pulses are divided into a plurality of discrete programming periods dedicated to a plurality of combinations of the plurality of threshold voltage subranges and the respective target threshold voltage ranges.

20. A memory device, comprising:
a memory array including a plurality of bit lines and a plurality of memory cells storing a same data value; and
control circuitry programming the plurality of memory cells, the plurality of memory cells storing the same data value prior to said programming by the control circuitry, said programming by the control circuitry including:
regarding the plurality of memory cells occupying a first threshold voltage range, characterizing memory cells in the plurality of memory cells as belonging to particular threshold voltage subranges in a plurality of threshold voltage subranges that divide the first threshold voltage range; and
applying programming pulses to program the plurality of memory cells, the programming pulses having magnitudes that vary depending on the particular threshold voltage subranges in the plurality of threshold voltage subranges to which the memory cells in the plurality of memory cells belong,
wherein consecutive programming pulses are applied between any two adjacent program verify pulses.

* * * * *